United States Patent [19]
Hoshino

[11] Patent Number: 6,133,127
[45] Date of Patent: Oct. 17, 2000

[54] METHOD FOR MANUFACTURING A SEMICONDUCTOR DEVICE

[75] Inventor: Akira Hoshino, Tokyo, Japan

[73] Assignee: NEC Corporation, Tokyo, Japan

[21] Appl. No.: 09/216,929

[22] Filed: Dec. 21, 1998

[30] Foreign Application Priority Data

Dec. 19, 1997 [JP] Japan ................................ 9-351304

[51] Int. Cl.$^7$ ............................................. H01L 21/3205
[52] U.S. Cl. ............................................ 438/584; 438/396
[58] Field of Search ...................................... 438/648, 649,
438/682, 683, 685, 584, 166; 437/203,
200, 173, 192

[56] References Cited

U.S. PATENT DOCUMENTS

| | | | |
|---|---|---|---|
| 5,250,465 | 10/1993 | Iizuak ........................................ | 437/173 |
| 5,563,100 | 10/1996 | Matsubara ................................ | 437/200 |
| 5,583,075 | 12/1996 | Ohzu et al. ............................... | 437/203 |
| 5,599,741 | 2/1997 | Matsumoto et al. ..................... | 437/192 |
| 5,940,693 | 8/1999 | Maekawa ................................. | 438/166 |

FOREIGN PATENT DOCUMENTS 61-96771   5/1986   Japan .
1-205469   8/1989   Japan .

*Primary Examiner*—David Nelms
*Assistant Examiner*—David Nhu
*Attorney, Agent, or Firm*—Young & Thompson

[57] ABSTRACT

A Ti film is formed on a semiconductor substrate having an element formed on the surface thereof by a sputtering method by using an ordinary DC magnetron sputtering unit under the conditions where Ar gas pressure is 1 mTorr and DC power is 4.4 kW. Under these conditions, the Ti film is formed as a continuous film within one second from the start of discharge so that if the Ti film is charged with secondary electrons generated by plasma used in sputtering, local charge-up does not occur. Thereafter, sputtering is continued and a Ti film of about 300 Å in thickness is formed on the entire surface. Hence, secondary plasma electrons are prevented form causing the breakdown of an insulating film of the element.

9 Claims, 5 Drawing Sheets

METHOD FOR MANUFACTURING A SEMICONDUCTOR DEVICE

BACKGROUND OF THE INVENTION

1. Field of the Invention

The present invention relates to a method for manufacturing a semiconductor device capable of preventing the breakdown of an insulating film formed on a semiconductor substrate in the manufacturing process of the semiconductor device and thereby manufacturing a highly reliable semiconductor device with a high yield.

2. Description of the Related Art

As semiconductor integrated circuits such as LSI become smaller in size, efforts to make elements smaller are attempted. Such efforts involve, for example, forming a shallower impurity diffusion layer serving as a source-drain region with a smaller area and forming narrower wirings connecting elements. Subsequently, electric resistances of the impurity diffusion layer and wiring increase, which adversely influences or hampers the high-speed operation of elements. To avoid this, in the conventional semiconductor device, a high melting point metal silicide layer is formed on the surface of the impurity diffusion layer so as to decrease the resistance of the impurity diffusion layer and thereby to increase the operation speed of the elements. An example of a semiconductor device intended to increase operation speed of element is a semiconductor device using a Ti silicide layer (U.S. Pat. No. 4,855,798).

FIGS. 1A through 1D are cross-sectional views in the order of manufacturing steps showing a method of manufacturing a conventional semiconductor device intended to increase operation speed by using a Ti silicide layer. As shown in FIG. 1A, an element separation film 11 consisting of an insulating film is selectively formed on the surface of a semiconductor substrate 20 thereby to demarcate an element region. Next, an oxide film (not shown) and a polysilicon film (not shown) are sequentially formed on the surface of the element region. Thereafter, the oxide film and the polysilicon film are patterned into a gate shape by lithography and dry etching, thereby forming a gate oxide film 14 consisting of the oxide film and a gate electrode 13 consisting of the polysilicon film. An oxide film (not shown) is then formed on the entire surfaces thereof and etched back, thereby forming a sidewall insulating film 12 consisting of the remaining oxide film on the sidewall of the gate electrode 13. After that, ions are implanted from above and heat treatment is conducted to the substrate 20, thereby to selectively form a diffusion layer 15.

A natural oxide film (not shown) formed on the gate electrode 13 and the diffusion layer 15 is then removed by wet etching using dilute hydrofluoric acid and the like. As shown in FIG. 1B, a Ti film 19b of about 300 Å in thickness is formed thereon.

As shown in FIG. 1C, heat treatment is conducted to the substrate and a Ti silicide layer 17 of C49 layer consisting of high resistance $TiSi_2$ is formed in a region in which the Ti film 19b and the gate electrode 13 contact with each other and a region in which the Ti film 19b and the diffusion layer 15 contact with each other in a self-aligned manner manner (see FIG. 1B). Since the heat treatment is conducted under nitrogen atmosphere, a TiN layer 18 of about several tens Å in thickness is formed on the surface of the unreacted Ti film 19c.

Next, as shown in FIG. 1D, the unreacted Ti film 19c and TiN film 18 on the element separation film 11 and on the sidewall insulating film 12 are removed. Heat treatment is then conducted to the substrate under nitrogen atmosphere, thereby transferring the high resistance Ti silicide film 17 to a Ti silicide layer of C54 film consisting of low resistance $TiSi_2$. Thus, in the conventional semiconductor device, the resistance of the surface of the diffusion layer 15 is decreased in an effort to increase the operation speed of elements.

If a semiconductor device is manufactured by the manufacturing method illustrated in FIGS. 1A through 1D, the following problems arise. During a sputtering process, secondary electrons contained in plasma and the like may pass through the Ti film 19b to the gate oxide film 14 and flow into the substrate 20. If an electric current flows between the Ti film 19b and the substrate 20, the dielectric breakdown of the gate oxide film 14 occurs thereby to cause withstand voltage failure. Due to this, the reliability of the semiconductor device greatly deteriorates and the manufacturing yield of the semiconductor device is lowered.

As a way to prevent the breakdown of the gate oxide film 14 charged with secondary electrons, there has been proposed a method of forming a Ti film not by normal sputtering but by collimate sputtering. FIG. 2 is a typical view showing the normal sputtering method using a DC magnetron. FIG. 3 is a typical view showing the collimate sputtering method. As shown in FIGS. 2 and 3, a target 31 is provided in a sputtering unit (not shown) and a cathode magnet 36 is provided above the target 31. A substrate 33 is disposed on a stage 34 provided below the target 31. Thereafter, plasma 32 is generated between the substrate 33 and the target 31 and a Ti film is formed on the substrate 33. The Ti film formation method is applied to both the normal sputtering and the collimate sputtering.

However, as shown in FIG. 2, if the normal sputtering method is employed, the plasma 32 is generated right above the substrate 33. Due to this, secondary electrons tend to fly into the substrate 33. In the collimate sputtering method shown in FIG. 3, by contrast, a collimator 35 is disposed between a substrate 33 and the plasma 32. The collimator 35 is provided with a plurality of holes passing through the thickness direction of the collimator 35 in parallel. If the plasma 32 passes through the holes of the collimator 35, secondary electrons from the plasma 32 are trapped by the collimator 35. It is, thus, possible to prevent the dielectric breakdown of the gate oxide film 14 shown in FIGS. 1A through 1D from occurring.

If the collimate sputtering method is employed as shown in FIG. 3, a Ti film attaches to the collimator 35 and the diameter of the collimator 35 is decreased. Owing to this, it is necessary to correct film formation rate as the target is consumed, which disadvantageously makes maintenance difficult. Besides, due to the attachment of the Ti film onto the collimator 35, target consumption efficiency deteriorates thereby to push up production cost. They are grave disadvantages to the mass production of semiconductor devices. The collimate sputtering is originally designed to form a film on the bottom surface of a hole in a good coating state even if the aspect ratio indicating the depth of a hole formed in the surface of a substrate to the diameter of the hole is high. Considering the above, it is less advantageous to use the collimate sputtering in the step of forming a Ti film which does not require a high coating state.

In view of the mass production of semiconductor devices, it is desirable to form a Ti film for forming a Ti silicide film by using the normal sputtering method. If the normal sputtering method is actually employed, it is required to provide a method for manufacturing a semiconductor device without the dielectric breakdown of the gate insulating film 14.

SUMMARY OF THE INVENTION

It is, therefore, an object of the present invention to provide a method for manufacturing a semiconductor device capable of preventing the breakdown of an insulating film of an element by secondary electrons of plasma in a case where a metal film is formed on elements on the surface of a semiconductor substrate.

A method for manufacturing a semiconductor device according to the present invention comprises the steps of forming an element on a silicon substrate; and forming a metal film on the element. The step of forming the metal film is conducted under a condition to allow a continuous metal film to be obtained by one second after the start of film formation.

The metal film may be formed by sputtering. In this case, the metal film is preferably formed under condition that DC power for forming the metal film is 4 to 10 kW. The metal film can be also formed by a plasma chemical vapor deposition method.

Further, the metal film may consist of a metal for forming a metal silicide by reacting with silicon. The metal film may consist of at least one metal selected from the group consisting of, for example, Ti, Co, Ni, Mo, W and Ta.

Moreover, the step of forming the element on the silicon substrate may include the steps of selectively forming an insulating film on the silicon substrate; forming a gate electrode on the insulating film; and forming a diffusion layer on a surface of the silicon substrate.

In the present invention, the continuous film refers to one in a case where the measured value of a sheet resistance at sputtering time is approximated by a formula: $Y=a/X$ (where a is a constant) in a graph having the sheet resistance of the metal film on the Y axis and the sputtering time on the X axis. The measured value is not necessarily expressed by the above formula in a strict sense and may fall within a range of $-40\%$ to $+40\%$ of the formula.

The inventors of the present invention conducted various experiments and studies in order to prevent the breakdown of an insulating film by secondary electrons from plasma. As a result, it was discovered that the cause of dielectric breakdown in a case where a metal film is formed on elements by a conventional method was the attachment of the metal film onto the element surface as a band-shaped discontinuous film in a film formation initial period. In other words, as shown in FIG. 4, in a film formation initial period from the start of forming a Ti film (or metal film) 19a to 2 to 3 seconds after the start, the Ti film 19a attaches to the element surface as a band-shaped discontinuous film. After that, a continuous Ti film is formed. The discontinuous Ti film 19a in the film formation initial period is in a state in which the film floats electrically. Due to this, the Ti film 19a is charged with secondary electrons contained in, for example, plasma for use in sputtering, and charge-up or an phenomenon that high potential is locally occurs. If the charge-up potential is increased to exceed a certain threshold value, an electric current flows across the substrate 20 after passing through an insulating film 14 provided below the Ti film 19a. In case of the discontinuous Ti film 19a formed above the gate electrode 13, in particular, an electric current passes through the gate oxide film 14 through the gate electrode 13 and flows across the substrate 20. As a result, the dielectric strength of the gate oxide film deteriorates and withstand voltage failure occurs in the end.

Considering the conventional problems, the present invention is designed to obtain a continuous film in the film formation initial period. Namely, as shown in FIG. 5, according to the present invention, a Ti film is formed on elements under conditions for allowing a continuous Ti film (metal film) 6a to be formed by one second after the start of forming the Ti film. Therefore, even if the Ti film 6a is charged with secondary electrons generated from, for example, plasma, local charge-up does not occur. Thus, it is possible to prevent the breakdown of the gate oxide film 4 and thereby to manufacture highly reliable semiconductor devices with a high yield.

DESCRIPTION OF THE PREFERRED EMBODIMENTS

Figure 1A:
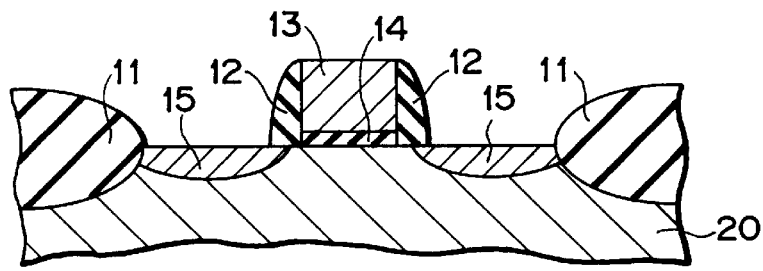
FIGS. 1A through 1D are cross-sectional views showing a conventional method for manufacturing a semiconductor device intended to increase operation speed by using a Ti silicide layer in the order of manufacturing steps.
Figure 1B:
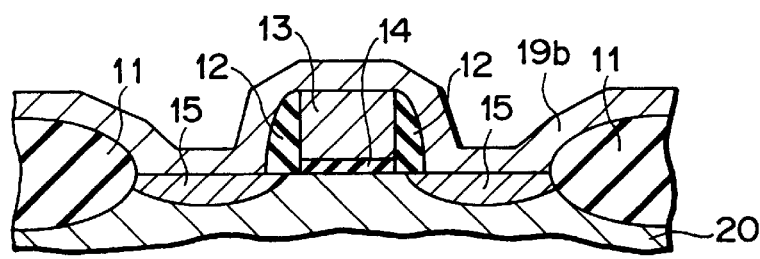
Figure 1C:
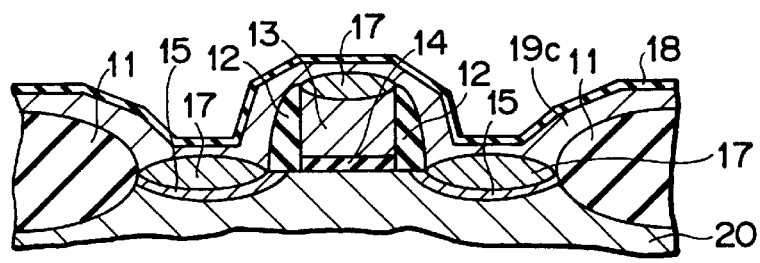
Figure 1D:
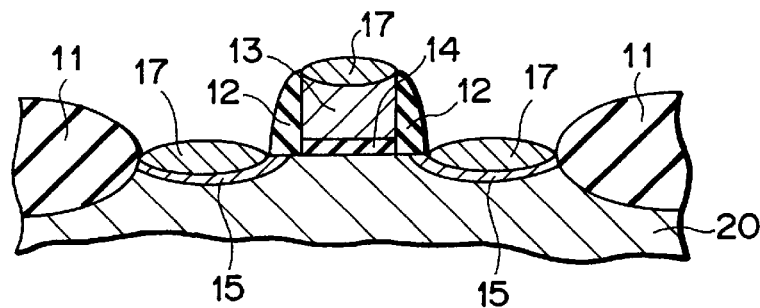
Figure 2:
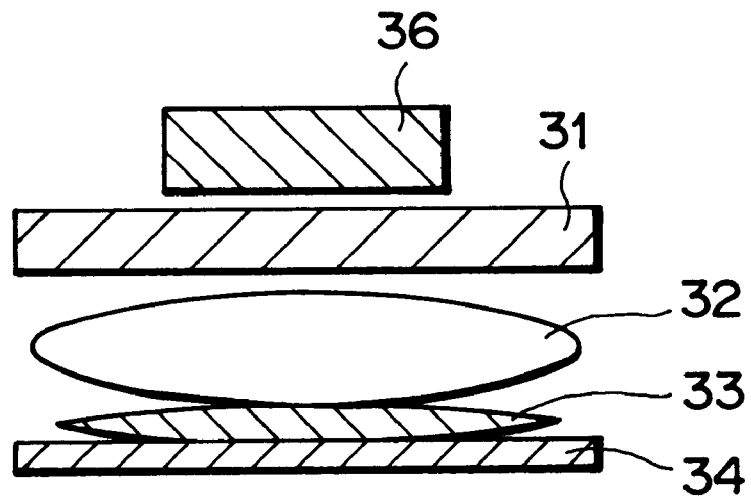
FIG. 2 is a typical view showing a normal sputtering method by a DC magnetron.
Figure 3:
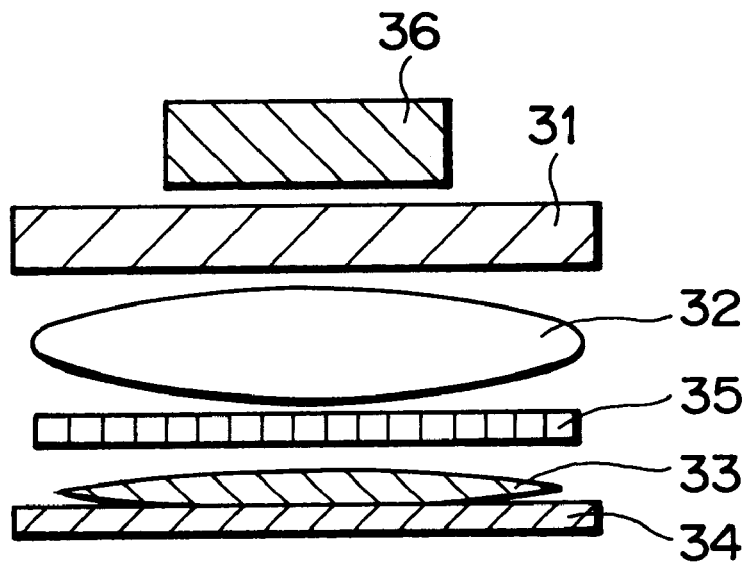
FIG. 3 is a typical view showing a collimate sputtering method.
Figure 4:
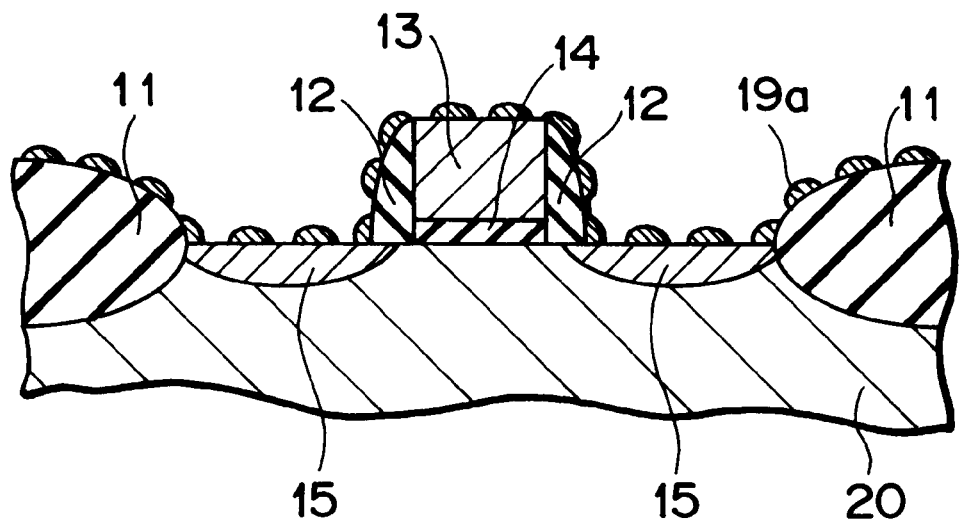
FIG. 4 is a cross-sectional view showing the initial state of a metal film when the metal film is formed on elements using the conventional manufacturing method.
Figure 5:
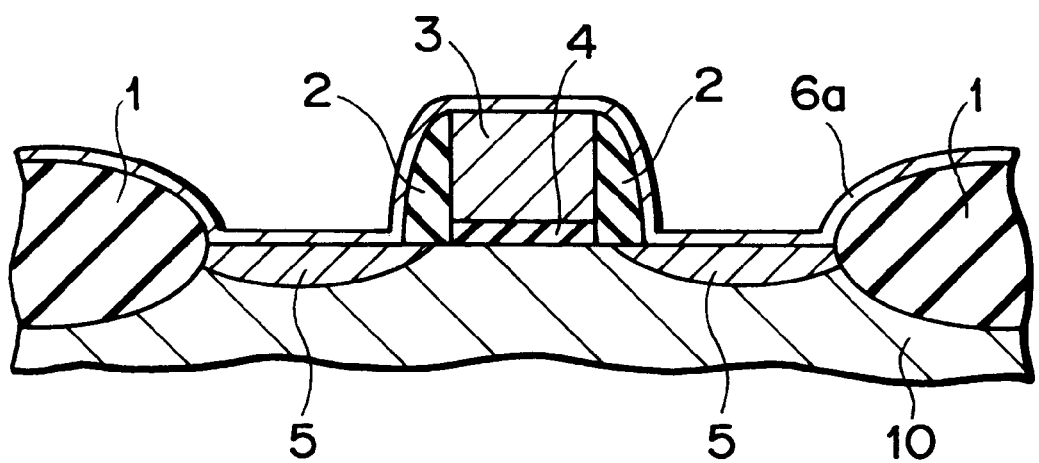
FIG. 5 is a cross-sectional view showing the initial state of a metal film when the metal film is formed on elements using a manufacturing method according to the present invention.
Figure 6A:
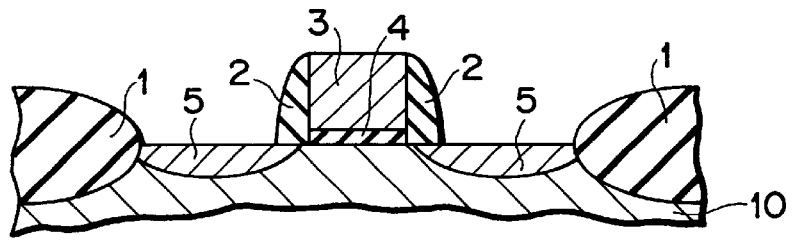
FIGS. 6A through 6E are cross-sectional views showing the semiconductor device manufacturing method in an embodiment according to the present invention.

A semiconductor device according to the preferred embodiment of the present invention will be concretely described with reference to the accompanying drawings. FIGS. 6A through 6D are cross-sectional views showing a method for manufacturing a semiconductor device in the embodiment of the present invention in the order of manufacturing steps. As shown in FIG. 6A, an element separation film 1 consisting of an insulating film is selectively formed on the surface of a semiconductor substrate 10 thereby to demarcate an element region. Next, on the surface of the element region, an oxide film (not shown) and a polysilicon film (not shown) are sequentially formed and then patterned into a gate shape by lithography and dry etching, thereby forming a gate oxide film 4 consisting of the oxide film and a gate electrode 3 consisting of the polysilicon film. Thereafter, an oxide film (not shown) is formed on the entire surface and then etched back, thus forming a sidewall insulating film 2 consisting of the remaining oxide film on the sidewall of the gate electrode 3. Ions are then implanted from above and heat treatment is conducted to the substrate 10, thereby selectively forming a diffusion layer 5.

Figure 6B:
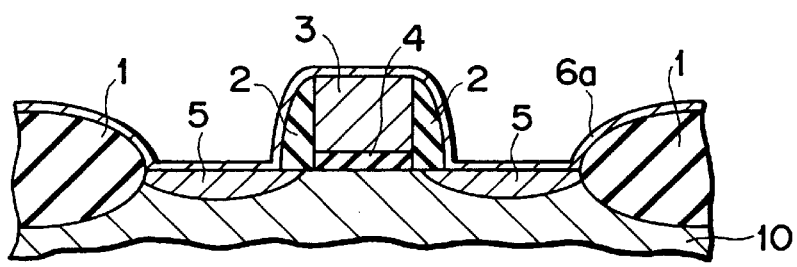
Figure 6C:
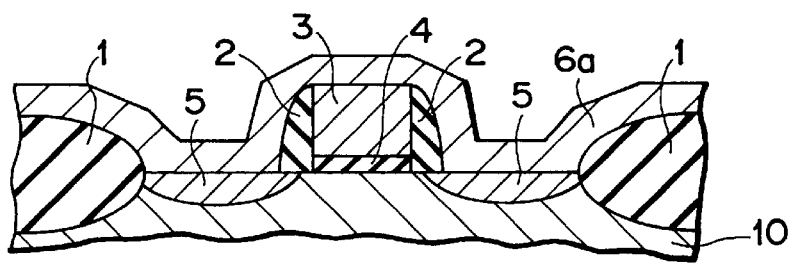

A natural oxide film (not shown) formed on the gate electrode 3 and the diffusion layer 5 is removed by wet etching using dilute hydrofluoric acid. Thereafter, as shown in FIGS. 6B and 6C, a Ti film 6a is formed on the surfaces thereof by sputtering. In this embodiment, the Ti film 6a is formed by using a normal DC magnetron sputtering unit under film formation conditions of, for example, Ar gas pressure of 1 mTorr and DC power (direct current power) of 4.4 kW. Under these conditions, in a film formation initial period from the start of discharge to 1 second after the start, the Ti film 6a remains a continuous film as shown in FIG. 6B. Even if the Ti film 6a is charged with secondary electrons generated from plasma or the like for use in sputtering, no local charge-up occurs. By continuing sputtering, the Ti film 6a of about 300 Å in thickness is formed on the entire surface.

Figure 6D:
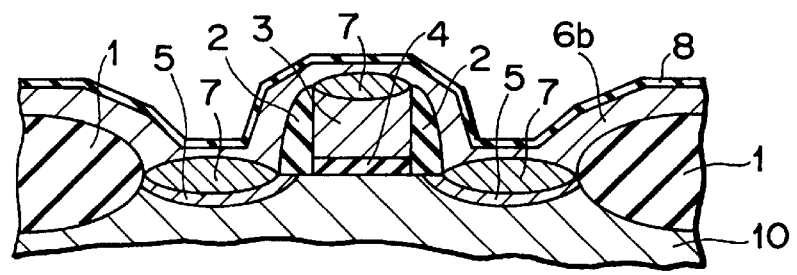

Next, as shown in FIG. 6D, heat treatment is conducted at 700° C. for 30 seconds under nitrogen atmosphere by using a lamp annealing instrument and a Ti silicide layer 7 of C49 layer consisting of high resistance $TiSi_2$ is formed in a self-aligned manner in a region in which the Ti film 6a and the gate electrode 3 contact with each other and a region in which the Ti film 6a and the diffusion layer 5 contact with each other. Since the heat treatment is being conducted under nitrogen atmosphere, a TiN layer 8 of about several tens Å in film thickness is formed on the surface of the Ti film 6a.

Figure 6E:
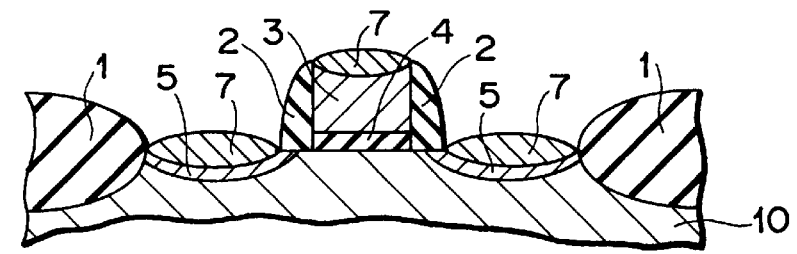

Thereafter, the unreacted Ti film 6b and TiN layer 8 on the element separation region 1 and the sidewall insulating film 2 shown in FIG. 6D are removed by a aqueous solution consisting of ammonia and hydrogen peroxide. Heat treatment is then conducted at 850° C. for 10 seconds under nitrogen atmosphere using the lamp annealing instrument, thereby transferring the high resistance Ti silicide layer 7 to a Ti silicide layer of C54 layer consisting of low resistance $TiSi_2$ as shown in FIG. 6E.

In this embodiment, as shown in FIG. 6B, while the Ti film 6a is being formed by sputtering, the Ti film 6a is not sporadic in a band-shaped state but continuous in the film formation initial period from the start of discharge to one second after the start.

Figure 7:
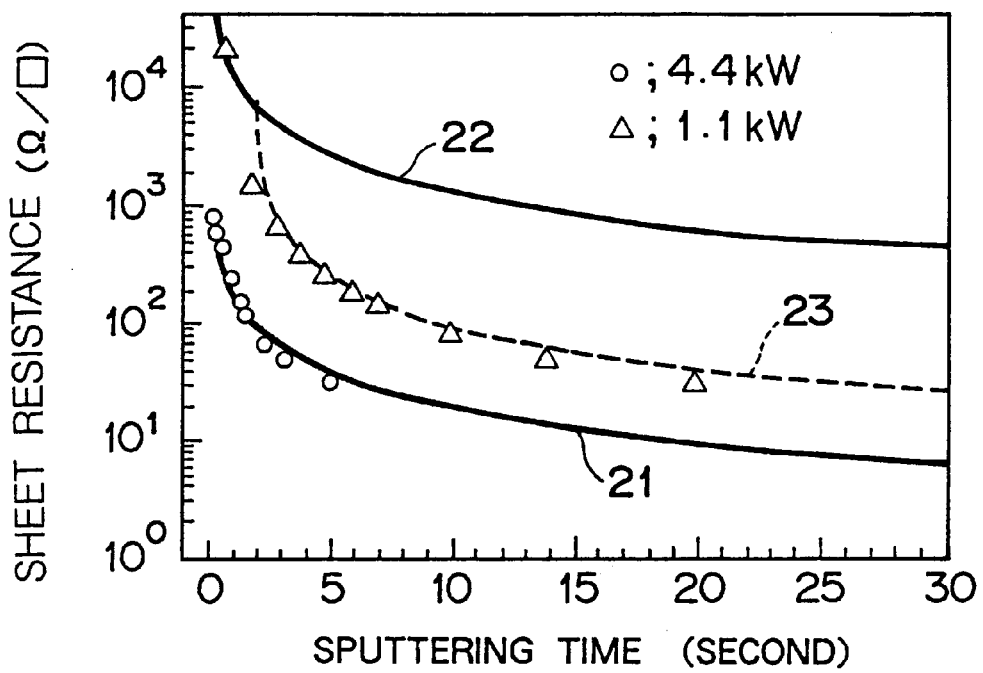
FIG. 7 is a graph showing the relationship between sheet resistance and sputtering time for the sputtering power of 4.4 kW and 1.1 kW, while the axis of ordinates indicates sheet resistance and the axis of abscissas indicates sputtering time.

FIG. 7 is a graph showing the relationship between sheet resistance and sputtering time for sputtering power of 4.4 kW and 1.1 kW while the ordinate axis indicates sheet resistance and the abscissa axis indicates sputtering time. In FIG. 7, ○ shows a measured value of a sheet resistance at a sputtering time while sputtering power is 4.4 kW and Δ shows a measured value of a sheet resistance at a sputtering time while sputtering power is 1.1 kW. Since sputtering time is proportional to a film thickness, it is possible to consider that the abscissa axis indicates the film thickness in FIG. 7. Normally, the sheet resistance of a continuous film and the film thickness satisfies a relationship as expressed by the following Formula 1 and sheet resistance is inversely proportional to film thickness, where the specific resistance is constant.

(Sheet Resistance)=(Specific Resistance)/(Film Thickness)  (1)

In this embodiment where sputtering power is 4.4 kW, fitting can be conducted by the method of least squares using an approximate function of Y=a/X corresponding to the Formula 1 above as indicated by solid line 21 in FIG. 7. Namely, while sputtering power is 4.4 kW, even 0.2 of a second after the start of discharge, a continuous Ti film can be formed. If fitting is conducted in the same manner by using an approximate function Y=a/X while sputtering power is 1.1 kW, measured points are shifted greatly from the fitting curve as indicated by solid line 22 in FIG. 7. This means that a part of the measured points do not satisfy the above Formula 1.

If fitting is conducted using an approximate function Y=a/(X−b) except for the measured point of about 3 seconds after the start of discharge while sputtering power is 1.1 kW, the approximate function is consistent with the measured points as shown in a broken line 23 as in the case of the sputtering power of 4.4 kW. This indicates that the removed measured points do not satisfy the above formula. In other words, while sputtering power is 1.1 kW, a continuous film is not formed for about three seconds after the start of discharge but discontinuous Ti films in band-shaped state appear sporadically. Even with the sporadic and discontinuous films, a current flows by the tunneling effect with a few volts if the distance between adjacent films is several to several tens Å, and sheet resistance can be measured. In the present invention, therefore, it is considered that a continuous film has been formed if a measured value of a sheet resistance for sputtering time is approximated by the formula Y=a/X (where a is a constant). In this case, however, the measured value is not necessarily expressed by the above formula in a strict sense and might fall within a range of −40% to +40% of the formula.

Figure 8:
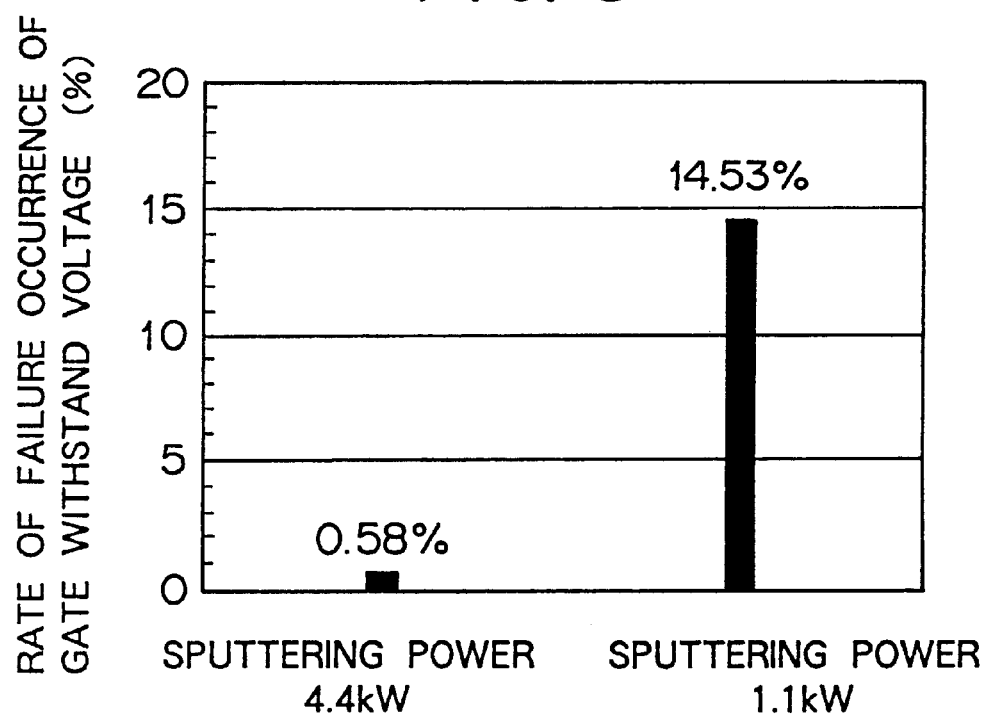
FIG. 8 is a graph showing the rate of failure occurrence in a case where a Ti film is formed with different sputtering powers while the ordinate axis indicates the rate of occurrence of gate withstand voltage failure.

FIG. 8 is a graph showing the rate of failure occurrence in a case where a Ti film is formed with different sputtering power while the ordinate axis indicates the rate of failure occurrence of gate withstand voltage. It is noted that the rate of failure occurrence was compared between a case where a Ti film is formed for forming a Ti silicide layer under the conditions according to this embodiment (i.e., sputtering power of 4.4 kW) under which a continuous film is formed by one second after the start of discharge and a case where a Ti film is formed under the conditions of the comparison example(i.e., sputtering power of 1.1 kW) under which discontinuous, band-shaped Ti films are formed for about 3 seconds after the start of discharge.

A method for measuring the rate of failure occurrence will be described. First, after a specimen having the constitution shown in FIG. 6A is formed as a test pattern, a Ti film is formed on the surface of the specimen and then removed therefrom by sputtering and a voltage of 0 to 12 V is variably applied between the gate electrode and the substrate. Voltage at which the dielectric breakdown of the gate oxide film occurs and high current thereby flow, is measured, and it is determined as a failure if the measured voltage is 3 V or less. The ratio of the number of defects to the number of measured points is calculated as a rate of failure occurrence. The normal gate oxide film has dielectric strength which does not deteriorate, depends on its film thickness and area. If, for example, the film thickness is about 100 Å and the area is about 32 mm², the film can withstand voltage of about 10 V.

As shown in FIG. 8, if a Ti film is formed with sputtering power of 4.4 kW, the rate of withstand voltage failure of the gate oxide film is quite low, and becomes 0.58%. This is because the Ti film is formed under the conditions where a continuous Ti film is formed from the start of forming the Ti film to one second after the start. On the other hand, if a Ti film is formed with sputtering power of 1.1 kW, band-shaped discontinuous films are formed from the start of discharge to about 3 seconds after the start and the rate of failure occurrence is as high as 14.53%. The rate increases by about 25 times of the rate in the embodiment. If a Ti film is formed by sputtering under conditions where a continuous film is formed from the start of film formation to one second after the start, then it is possible to obtain an advantage of preventing the occurrence of withstand voltage failure to the gate oxide film.

In the embodiment shown in FIGS. 6A to 6E, conditions under which a continuous film is formed from the start of film formation to one second after the start are set such that the DC power is increased from the conventional range to thereby increase the formation rate of a Ti film. In the present invention, conditions other than the DC power may be changed. It is possible to obtain the same advantage as in the case where the sputtering power is 4.4 kW if the method in which another film formation parameter such as gas pressure during sputtering is optimized or a cathode magnet for use in discharge is optimized is employed. Such a method has to satisfy the conditions under which a continuous metal film can be formed from the start of film formation to one second after the start.

In the above embodiment, description has been given to a case where sputtering is conducted for forming a Ti film. According to the present invention, it is possible to obtain the same advantage even if a Ti film is formed by using, for example, the plasma CVD method and the like under the conditions specified by the present invention. Further, in the above embodiment, description has been given to conditions for forming a Ti film to form a silicide layer. According to the present invention, the same advantage can be obtained by using, for example, one of Co, Ni, Mo, W and Ta as a metal film to form a silicide layer by reacting with silicon.

As described in detail so far, according to the present invention, conditions for forming a metal film on elements is appropriately specified to thereby form a continuous film from the start of the formation of the metal film to one second after the start. Due to this, it is possible to prevent the breakdown of an insulating film caused by the metal film being charged, whereby a semiconductor device of higher reliability can be manufactured with a high yield.

What is claimed is:

1. A method for manufacturing a semiconductor device comprising the steps of:

forming an element on a silicon substrate;

forming a metal film on the element; and protecting the element from a voltage breakdown by forming the metal film as a continuous metal film within one second after a start of film formation.

2. A method for manufacturing a semiconductor device according to claim 1, wherein said forming a metal film step comprises a sputtering process.

3. A method for manufacturing a semiconductor device according to claim 2, wherein a DC power for forming the metal film by said sputtering process is supplied in the range of 4 to 10 kW.

4. A method for manufacturing a semiconductor device according to claim 1, wherein said forming a metal film step comprises a plasma chemical vapor deposition method.

5. A method for manufacturing a semiconductor device according to claim 1, further comprising the step of forming a metal silicide by reacting the metal film with silicon.

6. A method for manufacturing a semiconductor device according to claim 5, wherein said forming a metal film step comprises forming a metal film having at least one metal selected from the group consisting of Ti, Co, Ni, Mo, W and Ta.

7. A method for manufacturing a semiconductor device according to claim 1, wherein said step of forming the element on the silicon substrate includes the steps of:

selectively forming an insulating film on said silicon substrate;

forming a gate electrode on said insulating film; and forming a diffusion layer on a surface of said silicon substrate.

8. The method of claim 7, wherein said protecting the element from a voltage breakdown step further comprises preventing a current flow through the gate electrode and the insulating film to the substrate during said forming a metal film step.

9. The method of claim 1, wherein said protecting the element from a voltage breakdown step comprises preventing a local charge accumulation from occurring on the metal film during said depositing a metal film step.

* * * * *